United States Patent [19]

Yamazaki

[11] Patent Number: 4,980,338
[45] Date of Patent: Dec. 25, 1990

[54] METHOD OF PRODUCING SUPERCONDUCTING CERAMIC PATTERNS BY ETCHING

[75] Inventor: Shunpei Yamazaki, Tokyo, Japan

[73] Assignee: Semiconductor Energy Laboratory Co., Ltd., Atsugi, Japan

[21] Appl. No.: 271,283

[22] Filed: Nov. 15, 1988

[30] Foreign Application Priority Data

Nov. 16, 1987 [JP] Japan .................. 62-289097

[51] Int. Cl.$^5$ .............................. C23F 1/02
[52] U.S. Cl. ...................... 505/1; 505/728; 156/643; 156/646; 156/656; 156/659.1; 156/667
[58] Field of Search .......... 505/1, 728, 919, 923; 156/643, 646, 656, 659.1, 667

[56] References Cited

U.S. PATENT DOCUMENTS 4,557,796 12/1985 Druschke et al. .......... 156/646 X
4,837,609 6/1989 Gurvitch et al. .......... 505/919 X

OTHER PUBLICATIONS

Matsui et al., "Reactive Ion Beam Etching of Y-Ba-Cu-O Superconductors", Appl. Phys. Lett. 52(1), Jan. 4, 1988.

Primary Examiner—David Simmons
Assistant Examiner—Thi Dang
Attorney, Agent, or Firm—Sixbey, Friedman, Leedom & Ferguson

[57] ABSTRACT

Superconducting ceramic patterns are produced by dry etching. A superconducting ceramic film is deposited by plasma CVD on a semiconductor substrate which is covered with a blocking film in advance. The ceramic film is coated with a photomask followed by dry etching in order to remove portions of the ceramic in accordance with the prescribed pattern. The etchant includes bromine.

16 Claims, 2 Drawing Sheets

METHOD OF PRODUCING SUPERCONDUCTING CERAMIC PATTERNS BY ETCHING

BACKGROUND OF THE INVENTION

This invention relates to a method of manufacturing superconducting oxide patterns by eching.

Recently, superconducting ceramic materials have been attracting a great deal of attention. These materials were first reported by IBM's Zurich Laboratories in the form of Ba-La-Cu-O type high temperature superconducting oxides. In addition, YBCO ($YBa_2Cu_3O_{6-8}$) type materials are also known. The applicant has proposed the method for depositing superconducting materials of these types in thin film form.

It has been known to produce desired patterns in ceramic films by wet etching using an acid etchant. Contrary to this, no dry etching method for ceramis films in gaseous phase has not been proposed, whereas $NF_3$ and $CF_4$ can not used as an etchant gas for etching of ceramics. In case of patterning of superconducting ceramic films, it is necessary to carry out dry etching rather than wet etching because the oxide ceramics are deteriorated by water.

SUMMARY OF THE INVENTION

It is therefore an object of the invention to provide a etching method which can be applied for superconducting ceramic patterns.

In order to accomplish the above and other objects, the etching of a superconducting ceramic film is performed by use of active bromine atoms. The active atoms are generated by, for example, the electron cyclotron resonance, the reactive ion etching, photo-excitation method utilizing ultraviolet light rays of 185 nm wavelength and so forth. By use of such a superconducting pattern for interconnection between devices formed within a semiconductor substrate, high frequency characteristics (high speed operations) are obtained in the light of high mobilities of electrons and holes in the superconducting material at the liquid nitrogen temperature.

DETAILED DESCRIPTION OF THE PREFERRED EMBODIMENTS

Figure 1A:
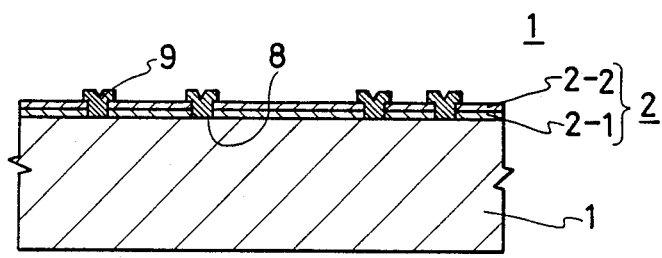
FIGS. 1(A) to 1(D) are cross sectional views showing manufacturing process of a semiconducrtor device in accordance with the present invention.

A substrate to be treated by the method in accordance with the present invention is coated with a blocking film made of such as $ZrO_2$, $SiTiO_3$, YSZ (yttirium stabilized zircon), yttrium oxide and strontium titanate or a platinum film (for covering electrodes), which shall not cause any interaction with oxide ceramics to be deposited at 500°-700° C. The substrate may be a silicon semiconductor substrate within which are formed a plurality of devices such as insulated gate field effect transistors, bopolar transistors, statistic induction type transistors, resistors and capacitances. Then, a superconducting ceramic film is deposited to a thickness of 0.1-10 microns. The substrate is preferably heat-resistant. The superconducting ceramic film is treated by anisotropic etching utilizing an etchant comprising bromine to produce superconducting patterns.

The melting points (MP) and the boiling points (BP) of the products of the etching reaction between etchants (comprising bromine, fluorine or chlorine) and superconducting ceramics are as follows.

|  | Br | Cl | F |
|---|---|---|---|
| (Yttrium) | | | |
| | $YBr_3$ | $YCl_3$ | $YF_3$ |
| MP | 904° C. | 680° C. | $\geq$1200° C. |
| BP | 904° C./2 mmHg | 1507° C. | $\geq$1500° C. |
| Sr (Strontium) | | | |
| | $SrBr_2$ | $SrCl_2$ | $SrF_2$ |
| MP | 643° C. | 873° C. | 1190° C. |
| BP | ? | ? | 2460° C. |
| Ba (Barium) | | | |
| | $BaBr_2$ | $BaCl_2$ | $BaF_2$ |
| MP | 847° C. | 963° C. | 1280° C. |
| BP | ? | 1560° C. | 2137° C. |
| Cu (Cupper) | | | |
| | $CuBr_2$ | $CuCl_2$ | $CuF_2$ |
| MP | 498° C. | 498° C. | 780° C. |
| BP | 900° C. | 993° C. | 950° C. |
| | CuBr | CuCl | CuF |
| MP | 504° C. | 422° C. | ? |
| BP | 1345° C. | 1366° C. | ? |

As seen from the above figures, all the bromine compounds of the constituent elements of the YBCO type superconducting ceramic have melting points not higher than 904° C. (the melting point of $YBr_3$). The fluorine compounds require 1200° C. (the melting point of $YF_3$) or higher temperatures to melt all the products. Generally, the lower the melting point is, the easier the vaporization is done under negative pressures or vacuum pressures. The use of chlorine gas is dangerous because it tends to react with stainless steel constituting the reaction chamber. The use of iodine is expensive and not suitable for commercialization.

Referring to FIGS. 1(A) to 1(D), an exemplary method of the present invention will be described. A substrate 1 is a single crystalline silicon semiconducor substrate within which are formed, in advance, active devices such as insulated gate field effect transistors and bopolar transistors, and passive devices such as resistors and capacitances. In the surface of the substrate, impurity areas are provided for making electrical contact with the inner devices by interconnecting means which is to be formed on the substrate. A dual insulating film 2 consisting of a 0.3 microns thick $SiO_2$ film 2—1 and a 0.4 microns thick zirconium film 2—2 is deposited by sputtering. Contact holes 8 are opened in the insulating film 2 corresponding to the impurity areas. Conductive films 9 of 0.1 to 10 microns thickness are formed at the holes in order to prevent acid-base reaction between the silicon semiconductor and the superconducting ceramic material to be deposited thereon. The conductive film 9 is made of, for example, platinum, gold, silver, tungsten and tinanuim, and patterned by photolithography.

Figure 1B:
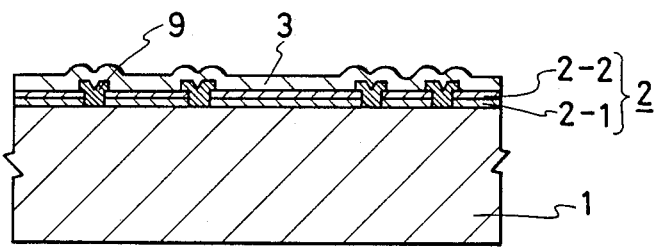
Figure 1C:
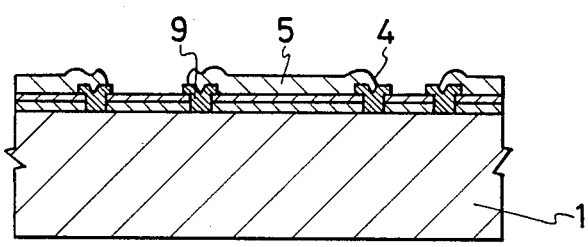
Figure 1D:
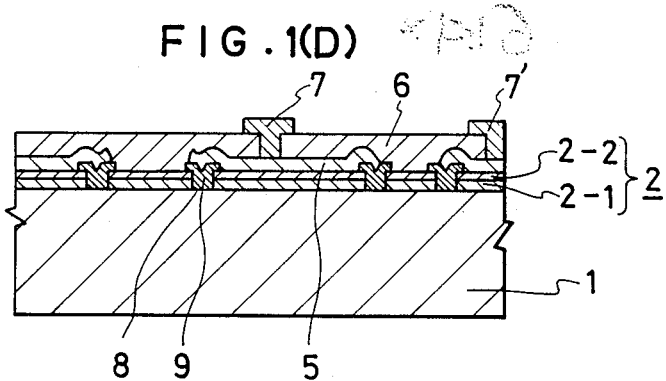

A superconducting ceramic film 3 is deposited to a thickness of 0.2-2.0 microns, e.g. 1 micron on the structure as shown in FIG. 1(B) by sputtering, screen press printing technique, vacuum evaporation, chemical vapor deposition or the like. The ceramic is preferably comprised of elements belonging to alkali earth metals (Group IIa), lanthanides (Group IIIa) and cupper. In case of sputtering deposition, the deposition conditions are, for example, the substrate temperature, 450° C.; the frequency, 50 Hz; and the output power, 100 W. After the sputtering deposition, the film is annealed at 700° C. for ten hours in an oxidizing atmosphere. The interaction between the ceramic film and the substrate is prevented from by virtue of the blocking conductive films 9. For reference, when annealing was effected to a ceramic film making direct contact with the underlying silicon semiconductor, it was confirmed by auger spectrometory that silicon oxide was formed at the contacting surface only after about 20 minutes annealing.

Figure 2:
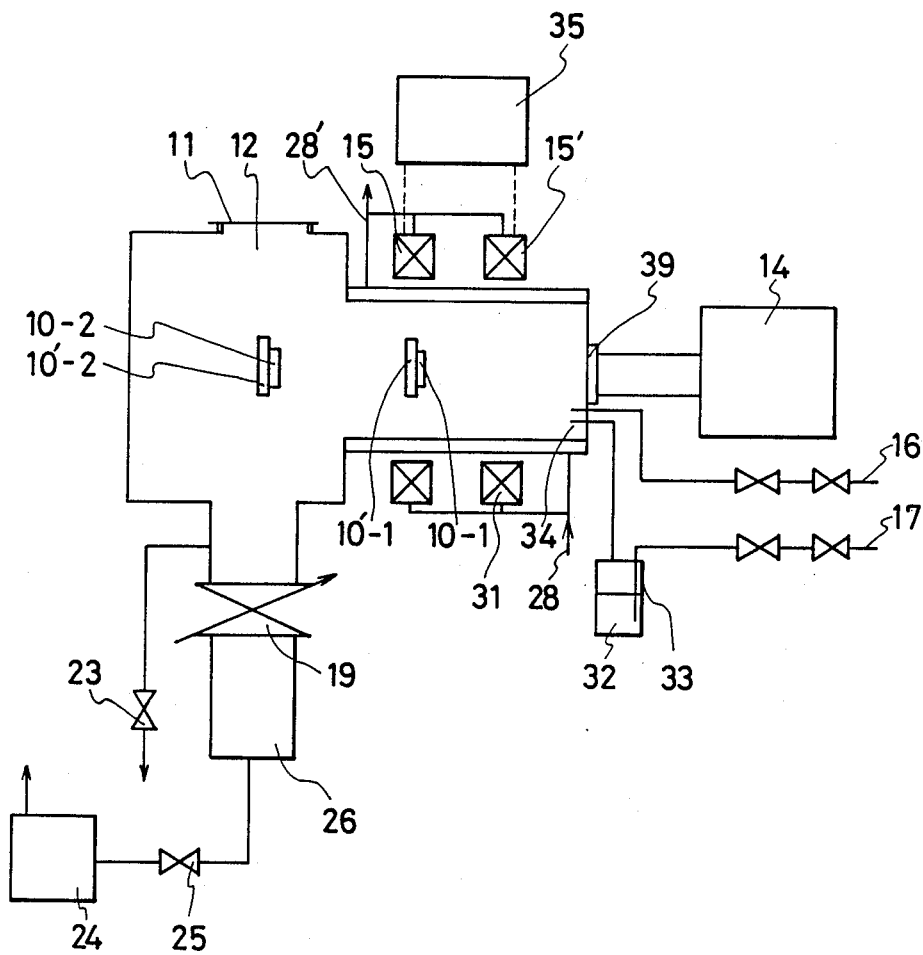
FIG. 2 is a schematic view showing a microwave-enhanced plasma etching apparatus utilizing magnetic fileds.

Next, the etching process in accordance with the present invention is described in details. In FIG. 2, a plasma processing apparatus is comprised of a vaccum chamber 12 including a plasma resonating space 31, a microwave generator 14 connected to the vaccum chamber 12 through a microwave introduction window 39 made of an artificial quartz, Helmhortz coils 15 and 15' surrounding the plasma resonating space 31, a power source 35 for supplying electric energy to the coils, an evacuating system connected to the vaccum chamber 12 through a pressure control valve 19 and consisting of a turbo molecular pump 26 and a rotary pump 24 connected through and a valve 25, gas introduction systems 16 and 17 and a water cooling system 28 and 28' provided for the system.

First, substrates 10-1 and 10-2 are mounted on holders 10'-1 and 10'-2 made of stainless steel in the chamber 12. The substrates have (100) planes and are made of, for example, MgO, SrTiO3, YZT or a silicon wafer coated with a $ZrO_2$ insulating film, on each of which a 2 microns thick oxide superconducting cramic film is deposited.

After evacuating the chamber 12 to $1\times 10^{-6}$ Torr or lower, an etchant gas comprising bromine, for example, $Br_2$ (MP=$-7.3°$ C., BP=58.78° C.), is introduced from the system 17. The bubbler 33 contains a liquid mixture including bromine. Bromine is carried by nitrogen gas passing therethrough at 200 SCCM. Eventually, the pressure of the etchant gas is 0.003 Torr in the chamber. Then, microwaves at 500 MHz or higher frequencies, e.g. 2.45 GHz are inputted from the microwave generator 14' at 0.1–1.0 KW, e.g. at 0.5 KW under a magnetic field of 875 Gauss induced by the Helmhortz coils 15 and 15'. Active bromine ions are generated in a high density plasma formed by virtue of the electron cyclotron resonance. The active ions attack the surface of the substrates 10-1 and 10-2 and produce patterns thereon in accordance with photomasks covering the surface in advance. The etching speed is 0.1 to 1.0 micron/min at room temperature. The ceramic material constituting the surface to be etched is removed in the form of gaseous compounds such as $YBr_3$, $BaBr_2$, $CuBr$ or the like. The Helmholtz coils 15 and 15' are cooled by the cooling system 28 and 28'. The positions of the substrates to be treated in the chamber are determined by the purpose. When mounted on the holder 10'-2, the substrate 10-2 is subjected to anisotropic etching in accordance with a divergent magnetic field.

Thermal annealing is effected to the superconducting film at 500°–1000° C. for 1–20 hours before or after the etching. The annealing is effective for improving the superconducting property of the film. The deposition step, the etching step and/or the annealing step may be repeated several times in order to construct a complex interconnection of zero resistance within a single or multi-layered structure. In accordance with experiments, the Tc onset of the superconducting pattern was 93° K. The resistance started to drop at 93° K. and substantially vanished at 83° K.

By use of this etching method, superconducting ceramic lines of a width of 10 microns to 1 micron can be produced as well as interval spaces therebetween of a width on the same order.

Superconducting ceramics for use in accordance with the present invention also may be prepared in consistence with the stoichiometric formulae $(A_{1-x}B_x)_yCu_zO_wX_v$, where A is one or more elements of Group IIIa of the Priodic Table, e.g., the rare earth elements, B is one or more elements of Group IIa of the Periodic Table, e.g., the alkaline earth metals including beryllium and magnesium, X is one or more elements of a group consisting of Ge, Sn, Pb, F and Cl, and x=0−1; y=2.0−4.0, preferably 2.5−3.5; z=1.0−4.0, preferably 1.5−3.5; w=4.0−10.0, preferably 6.0−8.0; and v=0−3. Also, superconducting ceramics for use in accordance with the present invention may be prepared consistent with the stoichiometric formulae $(A_{1-x}B_x)_yCu_zO_w$, where A is one or more elements of Group Vb of the Priodic Table such as Bi, Sb and As, B is one or more elements of Group IIa of the Periodic Table, e.g., the alkaline earth metals including beryllium and magnesium, and x=0.3−1; y=2.0−4.0, preferably 2.5−3.5; z=1.0−4.0, preferably 1.5−3.5; and w=4.0−10.0, preferably 6.0−8.0. Examples of this general formula are $BiSrCaCuCu_2O_x$ and $Bi_4Sr_3Ca_3Cu_4O_x$. Tc onset and Tco samples confirmed consistent with the formula $Bi_4Sr_yCa_3Cu_4O_x$ (y is around 1.5) were measured to be 40°–60° K., which is not so high. Relatively high critical temperatures were obtained with samples conforming to the stoichiometric formulae $Bi_4Sr_4Ca_2Cu_4O_x$ and $Bi_2Sr_{32}Ca_2Cu_2O_x$. The number x denoting the oxygen proportion is 6–10, e.g. around 8.1. Such superconducting materials can be formed by screen press printing, vacuum evaporation or CVD.

While a description has been made for several embodiments, the present invention should be limited only by the appended claims and should not be limited by the particular examles. What follow are some examples of modifications and variation according to the invention.

$CBr_4$ and HBr can be used as the etchant. HBr is not suitable depending on the case since hydrogen tends to react with oxygen constituting the ceramic and degrades the superconductivity thereof.

The application field of the present invention includes ULSIs such as 14M to 1 G bits memories and compound semiconductor devices such as III-V compound semiconductors, e.g. GaAs epitaxially grown on a silicon substrate.

APPENDIX

```
REM *********** INSCOP.BAS  - PROGRAM TO INSTALL COP - 4/8/89 - CRF ********
'$INCLUDE: 'QB.BI'
DECLARE SUB SHOWBANNER ()
DECLARE FUNCTION CPVERIFY% ALIAS "_cpverify" (BYVAL D%)

TYPE RECF
   F1 AS STRING * 10000
END TYPE
TYPE RECB
   F2 AS STRING * 3707
END TYPE
TYPE RECC
   F3 AS STRING * 108
END TYPE

DIM INREGS AS RegType, OUTREGS AS RegType
DIM REC1 AS RECF
DIM REC2 AS RECB
DIM REC3 AS RECC
DIM RECA$(100)

Blank$ = STRING$(75, 32)
D$ = " "
D% = 65

REM ****************** main loop ********************
CLS
IF CPVERIFY(D%) THEN
    LOCATE 23, 1
    PRINT "This diskette cannot be used to install COP":
    GOTO EOJ
END IF
GOSUB CHECKINS
IF D$ = "EXIT" THEN GOTO EOJ
CALL SHOWBANNER
GOSUB GETDRIVE
IF D$ = "EXIT" THEN GOTO EOJ
GOSUB GETFORMAT
IF D$ = "EXIT" THEN GOTO EOJ
GOSUB PUTINAUTO
IF D$ = "EXIT" THEN GOTO EOJ
GOSUB COPYFILES
IF D$ = "EXIT" THEN GOTO EOJ
GOSUB SETATTRIB
IF D$ = "EXIT" THEN GOTO EOJ
KILL "COP.EXE"
KILL "NOMAT.COM"
LOCATE 23, 21
PRINT "COP has been installed successfully          "
EOJ:
LOCATE 24, 1
END
REM **************** end main loop ********************

REM *********** ROUTINE TO CHECK FOR A PRIOR INSTALLATION **********

CHECKINS:

CHEKIT:
  NAM$ = "COP.EXE"
  NAM1$ = "NOMAT.COM"
  ON ERROR GOTO CHECKNG
  OPEN NAM$ FOR INPUT AS #1
  OPEN NAM1$ FOR INPUT AS #2
REM   OPEN NAM$ FOR BINARY AS #1
REM   OPEN NAM1$ FOR BINARY AS #2
REM   CNT% = 1
REM   GET #1, CNT%, REC3
REM   GET #2, CNT%, REC3
  CLOSE
  RETURN
```

```
CHECKNG:
  RESUME CKNG
CKNG:
  CLOSE
  LOCATE 23, 1
  PRINT "This diskette has already be used to install COP"
  D$ ='"EXIT"
  RETURN

REM **************ROUTINE TO GET THE DRIVE****************

GETDRIVE:
CLS
LOCATE 1, 1: PRINT CHR$(218);
FOR C% =.; TO 78: PRINT CHR$(196); : NEXT C%
PRINT CHR$(191)
FOR C% = 2 TO 23
   LOCATE C%, 1: PRINT CHR$(179);
   LOCATE C%, 80: PRINT CHR$(179);
NEXT C%
LOCATE 3, 1: PRINT CHR$(195);
FOR C% = 1 TO 78: PRINT CHR$(196); :NEXT C%
PRINT CHR$(180): LOCATE 24, 1: PRINT CHR$(192);
FOR C% = 1 TO 78: PRINT CHR$(196); : NEXT C%
PRINT CHR$(217);
LOCATE 2, 23
PRINT "COP  (tm) INSTALLATION PROGRAM   V1.0"
LOCATE 6, 18
PRINT "COP MUST BE INSTALLED ON YOUR PC'S HARD DISK"
LOCATE 7, 18
PRINT STRING$(44, 196)
LOCATE 9, 12
PRINT "1. Enter the name of the Disk Drive to install COP on: ";
LOCATE 11, 12
PRINT "2. Press ENTER"
LOCATE 15, 15
PRINT "NOTE:  The name of the drive you enter"
LOCATE 16, 24
PRINT "should be the letter of the hard"
LOCATE 17, 24
PRINT "disk your PC boots from."
LOCATE 18, 22
PRINT "(Change only if other than drive C: )"
LOCATED 23, 23
PRINT "Press ESC to quit this program"
Getit:
500 R = 9: C = 67: Cl = C: Buf$ = "C"
506 LOCATE R, C: PRINT Buf$; : LOCATE R, C, 1
510 LOCATE R + 1, 2: PRINT Blank$: LOCATE R, C, 1
512 X$ = INKEY$: IF X$ = "" THEN 512
515 IF (X$) CHR$(64) AND X$ (CHR$122) THEN 550
518 OPT = ASC(X$): X$ = CHR$(OPT AND 127)
520 IF X$ = CHR$(13) THEN 580
522 IF X$ = CHR$(27) THEN GOTO Dono
530 IF X$ = CHR$(8) AND C = Cl + 1 THEN C=C-1: LOCATE R,C: Buf$=""
    + RIGHT$(Buf$, (LEN(Buf$) - 1)): LOCATE R,Cl: PRINT Buf$:GO TO 510
535 IF X$ = CHR$(8) AND C ) Cl THEN C=C-1: LOCATE R,C-1: PRINT CHR$(32)
    :Buf$ =LEFT$(Buf$,C-Cl) + "" + RIGHT$(Buf$, (LEN(Buf$)-(C-Cl)-
    1)): LOCATE R. Cl: PRINT Buf$: GOTO 510
540 PRINT CHR$(7): GOTO 510
550 IF C = Cl + 1 THEN PRINT CHR$(7); : GOTO 510
560 Buf$ = LEFT$(Buf$, C-Cl) + X$ + RIGHT$(Buf$, LEN(Buf$) -
    (C - Cl + 1))
570 LOCATE R, C: PRINT CHR$(32); : LOCATE R, Cl: PRINT Buf$:
    C = C + 1: GOTO 510
590 D$ = Buf$
Openit:
    DRV$ = D$ + ":/TMPCOP"
    ON ERROR GOTO DNG
    OPEN DRV$ FOR OUTPUT AS #1
    CLOSE #1
    KILL DRV$
```

```
    LOCATE 23, 23
    PRINT "Press ESC to quit this program"
    RETURN
Dono:
    LOCATE 23, 2
    PRINT Blank$
    D$ = "EXIT"
    RETURN
DNG:
    RESUME DN1
DN1:
    LOCATE 23, 23
    PRINT "Invalid Drive, Try Again
    Delay = 2
    Df = 0
    ds = TIMER
    WHILE (Df (ds + Delay))
      'Df = TIMER
    WEND
    LOCATE 23, 23
    PRINT "Press ESC to quit this program"
    GOTO Getit
REM**********ROUTINE TO GET THE FORMAT OPTION***********

GETFORMAT:

FOR C% = 9 TO 18
    LOCATE C%, 2
    PRINT Blank$;
NEXT C%

LOCATE 4, 26
PRINT "Optional Feature: COPGUARD"
LOCATE 6, 12
PRINT "COPGUARD CAN PROTECT YOUR HARD DISK FROM BEING RE-FORMATED"
LOCATE 7, 12
PRINT STRING$(58, 196)
LOCATE 9, 12
PRINT "1. Do you wish to prevent unauthorized formatting (Y/N)? ";
LOCATE 11, 12
PRINT "2. Press ENTER"
LOCATE 15, 15
PRINT "NOTE:   If you enter 'Y' your hard disk"
LOCATE 16, 24
PRINT "format command will be disabled."
LOCATE 18, 24
PRINT "If you enter 'N', your hard disk"
LOCATE 19, 24
PRINT "can be reformatted ... Reformatting"
LOCATE 20, 24
PRINT "will remove your COP protection!"
LOCATE 23, 23
PRINT "Press ESC to quit this program"

Getfmt:
600 R = 9: C = 69: Cl = C: Buf$ = "Y"
606 LOCATE R, C: PRINT Buf$; ; LOCATE R,C,1
610 LOCATE R + 1, 2: PRINT Blank$: LOCATE R,C,1
612 X$ = INKEY$: IF X$ = "" THEN 612
615 IF (X$) CHR$(64) AND X$ (CHR$(122)) THEN §%)
618 OPT = ASC(X$): X$ = CHR$(OPT AND 127))
620 IF X$ = CHR$(13) THEN 680
622 IF X$ = CHR$(27) THEN GOTO Dono
630 IF X$ = CHR$(8) AND C=Cl + 1 THEN C = C - 1: LOCATE R.C:
Buf$="" + RIGHT$(Buf$, (LEN(Buf$)-1)): LOCATE R,Cl: PRINT Buf$:GO TO 610
635 IF X$ = CHR$(8) AND C) Cl THEN C = C -1: LOCATE R,C - 1: PRINT
    CHR$(32);: Buf$ = LEFT$(Buf$, C-Cl) + "" + RIGHT$(Buf$, (LEN
    (Buf$) -(C-Cl)-1)): LOCATE R,Cl: PRINT Buf$: GOTO 610
640 PRINT CHR$(7): GOTO 610
```

```
650 IF C = C1 + 1 THEN PRINT CHR$(7); : GOTO 610
660 Fuf$ = LEFT$(Buf$, C-C1) + X$ + RIGHT$(Buf$, LEN(Buf$)-(C-C1+1))
670 LOCATE R,C: PRINT CHR$(32); :LOCATE R, C1: PRINT Buf$: C=C =1:GOTO61
680 FANS$ = UCASE$(Buf$)
Chkit:
  IF FANS$ = "Y" OR FANS$ = "N" THEN RETURN
  LOCATE 23, 23
  PRINT " Invalid Entry, Try Again
  Delay = 2
  Df = 0
  ds = TIMER
  WHILE (Df ( (ds + Delay))
    Df = TIMER
  WEND
  LOCATE 23, 23
  PRINT "Press ESC to quit this program"
  GOTO Getfmt

REM ******************* PUT IN AUTOEXEC ROUTINE ***************

PUTINAUTO:
  NAM$ = "COP /N"
  NAM1$ = "NOMAT"
  FIL$ = D$ + ":\AUTOEXEC.BAT"
  ON ERROR GOTO Makeit
  OPEN FIL$ FOR INPUT AS #1
  A$ = "    "
  FOUND = 0

Putit:
  CNT% = 1
  WHILE (NOT EOF(1) AND NOT FOUND)
    LINE INPUT #1, RECA$(CNT%)
    IF RECA$(CNT%) = NAM$ THEN FOUND = -1
    CNT% = CNT% + 1
  WEND
  CLOSE #1
  IF FOUND THEN GOTO Autong Makeit:
  RESUME Mak1
Mak1:
  C% = 1
  ON ERROR GOTO Putng
  OPEN FIL$ FOR OUTPUT AS #2
  PRINT #2, NAM$
  IF FANS$ = "Y" THEN PRINT #2, NAM1$
  WHILE C% < CNT%
    PRINT #2, RECA$(C%)
    C% = C% + 1
  WEND
  CLOSE
  RETURN Putng:
  RESUME Put1
Put1:
  LOCATE 23, 10
  PRINT "An error has occured attemping to update AUTOEXEC.BAT"
  D$ = "EXIT"
  RETURN Autong:
  LOCATE 23, 23
  PRINT "COP has already been installed            "
  D$ = "EXIT"
  RETURN
```

```
REM ********************* FILE COPY ROUTINE *************************
COPYFILES:
   ON ERROR GOTO COPYNG
   LOCATE 23, 23
   PRINT "COP Installation in Progress...           ";
   OPEN "COP.EXE" FOR BINARY AS #3
   OPEN D$ + ":\COP.EXE" FOR BINARY AS #4
   CNT% = 1
   GET #3, CNT%, REC1
   PUT #4, CNT%, REC1
   CNT% = 10001
   GET #3, CNT%, REC1
   PUT #4, CNT%, REC1
   CNT% = 20001
   GET #3, CNT%, REC1
   PUT #4, CNT%, REC1
   CNT% = 30001
   GET #3, CNT%, REC2
   PUT #4, CNT%, REC2
   CLOSE IF FANS$ = "N" THEN RETURN
   OPEN "NOMAT.COM" FOR BINARY AS #3
   OPEN D$ + ":\NOMAT.COM" FOR BINARY AS #4
   CNT% = 1
   GET #3, CNT%, REC3
   PUT #4, CNT%, REC3
   CLOSE
RETURN COPYNG:
   RESUME Cop1
Cop1:
   LOCATE 23, 11
   PRINT "An error has occured attemping to install COP on drive "; D$
   D$ = "EXIT"
   RETURN REM ***************** SET ATTRIBUTE TO HIDDEN *******************
SETATTRIB:
   FILNAM$ = D$ + ":\COP.EXE" + CHR$(0)
   INREGS.ax = &H4300
   INREGS.dx = SADD(FILNAM$)
   CALL INTERRUPT(&H21, INREGS, OUTREGS)
   IF (&H1 AND OUTREGS.flags) <> 0 THEN GOTO SETNG
   INREGS.cx = OUTREGS.cx OR &H2
   INREGS.ax = &H4301
   CALL INTERRUPT(&H21, INREGS, OUTREGS)
   IF (&H1 AND OUTREGS.flags) <> 0 THEN GOTO SETNG IF FANS$ = "N" THEN RETURN
   FILNAM$ = D$ + ":\NOMAT.COM" + CHR$(0)
   INREGS.ax = &H4300
   INREGS.dx = SADD(FILNAM$)
   CALL INTERRUPT(&H21, INREGS, OUTREGS)
   IF (&H1 AND OUTREGS.flags) <> 0 THEN GOTO SETNG
   INREGS.cx = OUTREGS.cx OR &H2
   INREGS.ax = &H4301
   CALL INTERRUPT(&H21, INREGS, OUTREGS)
   IF (&H1 AND OUTREGS.flags) <> 0 THEN GOTO SETNG
   RETURN SETNG:
   LOCATE 23, 14
   PRINT "An error has occured attemping to set the attribute ";
   D$ = "EXIT"
   RETURN SUB SHOWBANNER STATIC
   CLS
   PRINT : PRINT
   PRINT "                              COP (tm)"
```

```
    PRINT : PRINT : PRINT
    PRINT "                        COMPUTER OWNER PROTECTION"
    PRINT "                           Installation Program"
    PRINT : PRINT
    PRINT "                        Copyright (c) 1989, Identifax, Inc."
    PRINT "                              Patent Pending"
    PRINT : PRINT : PRINT : PRINT
    PRINT "             All rights reserved. COP, Identifax Computer Recovery"
    PRINT "          Bureau and Identifax are all trademarks of Identifax, Inc."
    Delay = 4
    Df = 0
    ds = TIMER
    WHILE (Df < (ds + Delay))
       Df = TIMER
    WEND
END SUB REM ******** COP.BAS  - PROGRAM TO IDENTIFY A PC - 4/8/89 - CRF ******
DECLARE SUB MKDBOX (T%, B%, L%, R%)
DECLARE SUB MKBOX (T%, B%, L%, R%)
DIM Note(11), Order(10)
Delay = .15
MKSND = -1

DATA 0420, 0570, 0697, 1336, 1810, 1633, 1810, 1080, 1080, 1080, 1080
FOR i = 1 TO 11
   READ Note(i)
NEXT i DATA 1810, 1633, 1477, 1336, 1209, 1080, 1000, 0941, 0852, 0770
FOR i = 1 TO 10
   READ Order(i)
NEXT i REM***********CHECK FOR COMMAND LINE********
CL$ = COMMAND$
L = LEN(CL$)
IF L ) 0 AND MID$(CL$, 2, 1) = "N" THEN MKSND = 0

Regnum$ = "COP
FOR i = 1 TO 11
   j = 1
   WHILE (j ( 11)
   IF Note(i) = Order(j) THEN MID$(Regnum$, i) = MID$(STR$(j-i),2):j=11
   j = j + 1
   WEND
NEXT i Df = 0
FOR i = 1 TO 11
   Ds = TIMER
   WHILE (Df ( (Ds + Delay))
      Df = TIMER
   WEND
   SOUND Note(i), 2
   NEXT i IF MKSND THEN
   CLS
   T% = 1: B% = 23: L% = 1: R% = 79
   CALL MKDBOX(T%, B%, L%, R%)
   LOCATE 4, 22
   PRINT "This Computer is Registered with"
   LOCATE 7, 19
   PRINT "IDENTIFAX COMPUTER RECOVERY BUREAU (tm)"
   T% = 11: B% = 13: L% = 20: R% = 55
   CALL MKBOX(T%, B%, L%, R%)
   LOCATE 12, 22
   PRINT "Registration Number: "; Regnum$
   LOCATE 17, 20
```

```
PRINT "To locate owner call: 1 (800) 645-5404"
LOCATE 18, 19
PRINT "In New York State call: 1 (800) 832-5283"
LOCATE 24, 1
END IF
Df = 0
Ds = TIMER
WHILE (Df ( (Ds + Delay))
  Df = TIMER
WEND
SUB MKBOX (T%, B%, L%, R%) STATIC
  LOCATE T%, L%: PRINT CHR$(218);
  FOR C% = 1 TO R% - L% - 1: PRINT CHR$(196); : NEXT C%
  PRINT CHR$(191)
  FOR C% = T% + 1 TO B% - 1
    LOCATE C% = T% + 1 TO B% - 1
    LOCATE C%, R%: PRINT CHR$(179);
  NEXT C%
  LOCATE B%, L%: PRINT CHR$(192);
  FOR C% = ; TO R% - L% - 1: PRINT CHR$(196); : NEXT C%
  PRINT CHR$(217);
END SUB SUB MKDBOX (T%, B%, L%, R%) STATIC
  LOCATE T%, L%: PRINT CHR$(201);
  FOR C% = 1 TO R% - L% - 1: PRINT CHR$(205); : NEXT C%
  PRINT CHR$(187)

FOR C% = T% + 1 TO B% - 1
    LOCATE C%, L%: PRINT CHR$(186);
    LOCATE C%, R%: PRINT CHR$(186);
  NEXT C%

LOCATE B%, L%: PRINT CHR$(200);
  FOR C% = 1 TO R% - L% - 1: PRINT CHR$(205); : NEXT C%
  PRINT CHR$(188);
END SUB
```

I claim:

1. A superconducting pattern manufacturing method comprising:
   forming a ceramic film on a substrate, the ceramic film being a high-temperature superconducting oxide; and
   removing a prescribed portion of said ceramic film, as bromides of constituents of said ceramic, by dry etching utilizing an etchant comprising bromine in order to produce a superconducting pattern.

2. The method of claim 1 wherein said substrate is a semiconduct substrate within which semiconductor devices will be formed.

3. The method of claim 2 further comprising the step of forming a blocking film on said semiconductor substrate in advance of forming said ceramic film in order to prevent said ceramic film from directly contacting said semiconductor.

4. The method of claim 3 wherein said blocking film comprises a conductive portion with which said superconducting ceramic pattern is electrically connected to a surface portion of said semiconductor substrate and an insulating film which insulates said superconducting ceramic pattern from said semiconductor substrate.

5. The method of claim 4 wherein said conductive portion is made of platinum, gold, silver, tungsten or titanium.

6. The method of claim 4 wherein said insulating portion is made of zirconium oxide, YSZ, yttrium oxide, strontium oxide or strontium titanate.

7. The method of claim 1 wherein said forming step is carried out by a microwave enhanced plasma CVD.

8. The method of claim 7 wherein said plasma CVD is carried out under a magnetic field.

9. The method of claim 1 wherein said ceramic film is formed in consistence with the stoichiometric formulae $(A_{1-x}B_x)_y Cu_z O_w X_v$, where A is one or more elements of Group IIIa of the Periodic Table, the, B is one or more elements of Group IIa of the Periodic Table, including beryllium and magnesium, X is one or more elements of a group consisting of Ge, Sn, Pb, F and C.

10. The method of claim 9, wherein A is one or more of the rare earth elements and B is one or more of the alkaline earth metals.

11. The method of claim 1 wherein said etchant includes bromine.

12. The method of claim 1 wherein said etchant includes $CBr_4$.

13. The method of claim 1 wherein said etchant includes HBr.

14. The method of claim 1 further comprising the step of covering said ceramic film with a photomask in accordance with said prescribed pattern prior to said removing step.

15. The method of claim 1 further comprising the step of annealing said ceramic film before or after said removing step.

16. A superconducting pattern manufacturing method comprising:
   forming a ceramic film on a substrate, the ceramic film being a high-temperature superconducting oxide; and
   removing a prescribed portion of said ceramic film, as bromide of the consittuents of said ceramic, by dry etching utilizing an etchant comprising $Br_2$ or HBr in order to produce a superconducting pattern.

* * * * *

UNITED STATES PATENT AND TRADEMARK OFFICE
CERTIFICATE OF CORRECTION

PATENT NO. : 4,980,338

DATED : December 25, 1990

INVENTOR(S) : Shunpei Yamazaki

It is certified that error appears in the above-identified patent and that said Letters Patent is hereby corrected as shown below:

--Column 5 subject appendix through column 17 before "I claim:" should be deleted.--

Signed and Sealed this

Eighth Day of June, 1993

Attest:

MICHAEL K. KIRK

Attesting Officer

Acting Commissioner of Patents and Trademarks